United States Patent
Wang et al.

(10) Patent No.: US 10,497,764 B2
(45) Date of Patent: Dec. 3, 2019

(54) SUBSTRATE, METHOD OF PREPARING THE SAME, AND DISPLAY DEVICE

(71) Applicant: BOE Technology Group Co., Ltd., Beijing (CN)

(72) Inventors: Huifeng Wang, Beijing (CN); Jing Gan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/974,971

(22) Filed: May 9, 2018

(65) Prior Publication Data

US 2019/0123116 A1 Apr. 25, 2019

(30) Foreign Application Priority Data

Oct. 23, 2017 (CN) .......................... 2017 1 0992027

(51) Int. Cl.
*H01L 51/00* (2006.01)
*H01L 27/32* (2006.01)
*H01L 51/52* (2006.01)

(52) U.S. Cl.
CPC ...... *H01L 27/3246* (2013.01); *H01L 51/0004* (2013.01); *H01L 51/5206* (2013.01); *H01L 51/5221* (2013.01)

(58) Field of Classification Search
CPC ............. H01L 27/3246; H01L 51/5206; H01L 51/0004; H01L 51/5221
USPC .......................................................... 257/40
See application file for complete search history.

(56) References Cited

U.S. PATENT DOCUMENTS

| 8,130,177 B2 * | 3/2012 | Nakatani ............. H01L 51/0003 313/498 |
| 2016/0247862 A1 | 8/2016 | Song et al. |
| 2017/0278914 A1 | 9/2017 | Cui et al. |
| 2017/0279049 A1 | 9/2017 | Dai |

FOREIGN PATENT DOCUMENTS

| CN | 104167430 A | 11/2014 |
| CN | 104638147 A | 5/2015 |
| CN | 105774279 A | 7/2016 |
| CN | 105826358 A | 8/2016 |
| CN | 107113937 A | 8/2017 |

OTHER PUBLICATIONS

First Office Action, including Search Report, for Chinese Patent Application No. 201710992027.7, dated Dec. 6, 2018, 9 pages.

* cited by examiner

*Primary Examiner* — Vu A Vu
(74) *Attorney, Agent, or Firm* — Westman, Champlin & Koehler, P.A.

(57) ABSTRACT

A substrate, a method of preparing the substrate and a display device are provided. The substrate includes: a base substrate; a pixel defining layer on the base substrate, the pixel defining layer defining a plurality of opening regions arranged in an array, each of the plurality of opening regions having a plurality of sidewalls; and a barrier structure attached to at least one sidewall of at least one opening region. A distance from an upper surface of the barrier structure to the base substrate is less than a distance from an upper surface of the pixel defining layer to the base substrate, and at least a part of surfaces of the barrier structure are lyophobic.

20 Claims, 7 Drawing Sheets

SUBSTRATE, METHOD OF PREPARING THE SAME, AND DISPLAY DEVICE

CROSS-REFERENCE TO RELATED APPLICATION

This application claims the benefit of Chinese Patent Application No. 201710992027.7 filed on Oct. 23, 2017 in the State Intellectual Property Office of China, the whole disclosure of which is incorporated herein by reference.

TECHNICAL FIELD

The present disclosure relates to the field of display technology, and in particular, to an substrate, a method of preparing the substrate, and a display device.

DESCRIPTION OF THE RELATED ART

An organic light emitting diode (OLED) display panel generally includes a base substrate, an anode on the base substrate, a light emitting functional layer including an organic material film layer, and a cathode. The organic material film layer may be manufactured using inkjet printing technology. When the organic material film layer is manufactured by using the inkjet printing technology, it is necessary to form a pixel defining layer on the base substrate, and then ink a solution of organic light emitting material onto a glass substrate on which the pixel defining layer is formed, to form the organic material film layer.

SUMMARY

In an aspect, it is provided a substrate including: a base substrate; a pixel defining layer on the base substrate, the pixel defining layer defining a plurality of opening regions arranged in an array, each of the plurality of opening regions having a plurality of sidewalls; and a barrier structure attached to at least one sidewall of at least one opening region, wherein a distance from an upper surface of the barrier structure to the base substrate is less than a distance from an upper surface of the pixel defining layer to the base substrate, and at least a part of surfaces of the barrier structure are lyophobic.

For example, an upper surface of the barrier structure is lyophobic.

For example, the barrier structure is attached to all sidewalls of the at least one opening region.

For example, the substrate further includes a plurality of electrodes on the base substrate, and there is a gap between a lower surface of the barrier structure and the plurality of electrodes.

For example, the substrate further includes a plurality of electrodes on the base substrate, and a lower surface of the barrier structure contacts the plurality of electrodes.

For example, the upper surface of the pixel defining layer is lyophobic.

For example, a material of the barrier structure is the same as a material of the pixel defining layer.

For example, at least one of a material of the barrier structure and a material of the pixel defining layer includes fluorine-containing resin.

For example, a difference between the distance from an upper surface of the barrier structure to the base substrate and the distance from an upper surface of the pixel defining layer to the base substrate is in a range of 0.5~5 μm.

For example, a distance from the upper surface of the barrier structure to the plurality of electrodes is in a range of 0.1~5 μm.

In another aspect, it is provided a display device including the substrate as described above.

In a further aspect, it is provided a method of preparing a substrate, including:

providing a base substrate; and forming a pixel defining layer and a barrier structure on the base substrate, the pixel defining layer defining a plurality of opening regions arranged in an array, each of the plurality of opening regions having a plurality of sidewalls, the barrier structure being attached to at least one sidewall of at least one opening region, wherein a distance from an upper surface of the barrier structure to the base substrate is less than a distance from an upper surface of the pixel defining layer to the base substrate, and at least a part of surfaces of the barrier structure are lyophobic.

For example, forming the pixel defining layer and the barrier structure on the base substrate includes:

forming the pixel defining layer on the base substrate; and forming the barrier structure on the at least one sidewall of the at least one opening region.

For example, forming the pixel defining layer and the barrier structure on the base substrate includes:

forming the barrier structure on the base substrate; and forming the pixel defining layer on the base substrate on which the barrier structure has been formed.

For example, forming the pixel defining layer on the base substrate includes: forming the pixel defining layer on the base substrate through one patterning process.

For example, forming the barrier structure on the base substrate includes: forming the barrier structure on the base substrate through one patterning process.

For example, forming the pixel defining layer on the base substrate through one patterning process includes:

forming a first photoresist film on the base substrate; and exposing the first photoresist film with a first mask, then developing and baking the first photoresist film to form the pixel defining layer.

For example, forming the barrier structure on the base substrate through one patterning process includes:

forming a second photoresist film on the base substrate; and exposing the second photoresist film with a second mask, then developing and baking the second photoresist film to form the barrier structure.

For example, a material of the barrier structure is the same as a material of the pixel defining layer.

For example, at least one of a material of the barrier structure and a material of the pixel defining layer includes fluorine-containing resin.

Figure 1A:
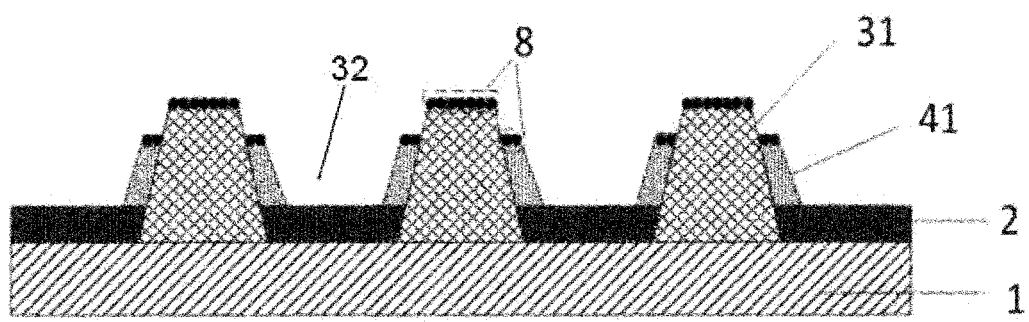
FIG. 1a is a schematic structural view of a substrate according to an embodiment of the present disclosure.

It should be noted that shapes and sizes of components in the drawings do not reflect true scale and are only intended to illustrate the present disclosure.

DETAILED DESCRIPTION OF PREFERRED EMBODIMENTS

To make objectives, technical solutions and advantages of the present disclosure more clear, the present disclosure will be further described in detail below with reference to the accompanying drawings. Obviously, the described embodiments are merely a part of but not all of embodiments of the present disclosure. All other embodiments obtained by those skilled in the art based on the embodiments of the present disclosure without creative efforts shall fall within the protection scope of the present disclosure.

Compared with a liquid crystal display, an organic electroluminescent display has advantages such as self-luminescence, fast response, wide viewing angle, high brightness, colorfulness and light weight and the like. A method of manufacturing a film layer in the organic electroluminescent device mainly includes two kinds of processes, i.e. vapor deposition process and solution process. The vapor deposition process is suitable for a film formation of organic small molecule material, and has advantages of good film formation uniformity and relatively mature technology. The solution process includes spin coating, inkjet printing, nozzle coating, and screen printing. Due to the high material utilization of the inkjet printing technology and its outstanding advantages in production of large-size products, the inkjet printing technology is widely used in the manufacturing process of a large-size organic electroluminescent display. When the organic material film layer is manufactured by using the inkjet printing technology, it is necessary to form a pixel defining layer on a glass substrate, and then ink a solution of organic light emitting material onto the glass substrate on which the pixel defining layer has been formed, to form the organic material film layer.

In the related art, an upper surface of the pixel defining layer is lyophobic within a certain thickness due to the material used for forming the pixel defining layer, and other portions of the pixel defining layer are lyophilic. During inkjet printing, the solution of the organic light emitting material will climb along sidewalls of the pixel defining layer, thereby affecting the uniformity of film formation of the solution in pixel areas.

Specifically, a material used for forming the pixel defining layer contains a component of fluororesin. During patterning and processing the pixel defining layer, the component of fluororesin moves to an upper surface of the material of the pixel defining layer, and is about 100 nm thick, so that a portion of the pixel defining layer from the upper surface of the pixel defining layer to a position which is distant from the upper surface by about 100 nm is lyophobic (the portion may also be described as a portion of the pixel defining layer in uppermost about 100 nm thickness), that is, a lyophobic layer is formed. The other portions of the pixel defining layer except the lyophobic portion are lyophilic. The lyophilic abilities of the lyophilic portions are different. The lyophilic abilities are gradually increased in a direction from the upper surface to a lower surface of the pixel defining layer. In this way, ink droplets may climb along sidewalls of the pixel defining layer towards the upper surface of the pixel defining layer during the inkjet printing. Therefore, ink droplets of a certain thickness are accumulated on the sidewalls of the pixel defining layer, and the ink droplets on the sidewalls of the pixel defining layer have a little or no contribution to light emission of the display panel, resulting in uneven display among various pixels or abnormal display. In addition, as the ink droplets climb to a large height, the ink droplets accumulated at a transition position between an anode and the pixel defining layer (that is, at a boundary where the ink droplets start to climb from the anode to the pixel defining layer) becomes thicker. The thicker ink droplets also have little or no contribution to the light emission of the display panel. Moreover, the thicker ink droplets also reduce an effective light emitting area of a light emitting layer above the anode, thereby affecting luminous efficiency.

It should be noted that the embodiments of the present disclosure are described in further detail below by taking an array substrate as an example. However, the embodiments of the present disclosure may not be limited to the array substrate and may be applied to other types of substrates, for example, any substrate having a pixel defining layer, or any substrate having a light emitting layer.

According to an embodiment of the present disclosure, an array substrate is provided. As shown in FIG. 1a, the array substrate includes: a base substrate 1, a plurality of anodes 2 arranged in an array on the base substrate 1, and a pixel defining layer 31 between each two adjacent anodes of the plurality of anodes 2.

The array substrate further includes a barrier structure 41. The barrier structure 41 is attached to sidewalls of the pixel defining layer 31. A distance from an upper surface of the barrier structure 41 to the base substrate 1 is less than a distance from an upper surface of the pixel defining layer 31 to the base substrate 1. As shown in FIG. 1a, a distance from an upper surface of the barrier structure 41 to an upper surface of the base substrate 1 in vertical direction is less than a distance from an upper surface of the pixel defining layer 31 to an upper surface of the base substrate 1 in vertical direction. For example, a height of the barrier structure 41 is less than a height of the pixel defining layer 31. The upper surface of the barrier structure 41 is lyophobic.

Specifically, in the illustrated embodiment, the pixel defining layer 31 is located on the base substrate 1 and defines a plurality of opening regions 32 arranged in an array, and each opening region 32 has a plurality of sidewalls. The barrier structure 41 is attached to at least one sidewall of at least one opening region 32. For example, the barrier structure 41 may be attached to all the sidewalls of the at least one opening region 32. For example, the barrier structure 41 may be attached to all the sidewalls of each opening region 32.

In the above array substrate provided by the embodiment of the present disclosure, a climbing height of the ink droplets in the pixel is dependent on the height of the barrier structure with the arrangement of the barrier structure. Since the distance from the upper surface of the barrier structure to the base substrate is less than the distance from the upper surface of the pixel defining layer to the base substrate, a climbing effect of the ink droplets in the pixel may be effectively suppressed with the arrangement of the barrier structure, thereby improving a display effect of the display panel.

The distance from the upper surface of the barrier structure to the base substrate is less than the distance from the upper surface of the pixel defining layer to the base substrate. Further, as the barrier structure is made of a material containing a component of fluororesin, the component of fluororesin moves to the upper surface of the barrier structure and is about 100 nm thick during patterning and processing the barrier structure, so that a portion of the barrier structure from the upper surface of the barrier structure to a position which is distant from the upper surface by about 100 nm (the portion may also be described as a portion of the barrier structure in uppermost about 100 nm thickness) is lyophobic, that is, a lyophobic layer 8 is also formed in the barrier structure, as shown in FIG. 1a. With such an arrangement of the barrier structure, the climbing height of the ink droplets is greatly decreased, so that the display uniformity among the pixels and the luminous efficiency of each pixel are improved, thereby improving the display effect of the display panel.

In the illustrated embodiment, the barrier structure is attached to all the sidewalls of the pixel defining layer 31 (i.e. all the sidewalls of each opening region 32). The barrier structure is attached to all the sidewalls of the opening region, so that the climbing effect of the ink droplets on all the sidewalls of the opening region can be suppressed. With such an arrangement, it can be ensured that the ink droplets do not climb along any sidewall of the pixel defining layer towards the upper surface of the pixel defining layer.

It should be noted that, in the array substrate provided by the embodiment of the present disclosure, the barrier structure may be formed on at least one sidewall of the opening region as needed. In other words, the barrier structure may not be formed on one sidewall or some sidewalls of the opening region. In this way, the material consumed by the barrier structure may be saved, and a process difficulty of forming the barrier structure may be reduced. In this case, when inkjet printing is performed, only the sidewall on which the barrier structure is formed can suppress the ink droplets from climbing along the pixel defining layer.

In the illustrated embodiment, a lower surface of the barrier structure 41 is in contact with the anodes 2.

Figure 1B:
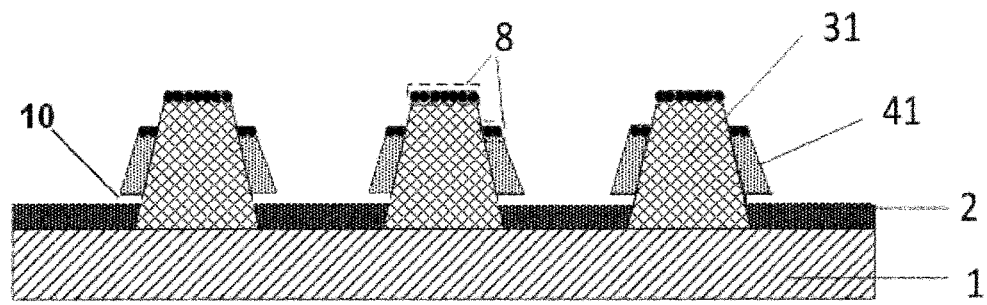
FIG. 1b is a schematic structural view of a substrate according to another embodiment of the present disclosure.

In an alternative embodiment, the lower surface of the barrier structure may not be in contact with the anodes, that is, there is a gap 10 between the lower surface of the barrier structure and the anodes, as shown in FIG. 1b. In this embodiment, the barrier structure may also suppress the ink droplets from climbing towards the upper surface of the pixel defining layer, and the material consumed by the barrier structure can be saved. However, since the lower surface of the barrier structure is not in contact with the anodes, a requirement for an etching process may be relatively high. Therefore, in order to reduce the process difficulty of forming the barrier structure, the lower surface of the barrier structure may be brought into contact with the anodes.

For example, in the above array substrate provided by the embodiment of the present disclosure, a material of the barrier structure and a material of the pixel defining layer may be the same, and for example, each may include fluorine-containing resin. As the material of the barrier structure is set to be the same as the material of the pixel defining layer, it is advantageous to attach the barrier structure to the sidewalls of the opening region, so as to prevent the barrier structure from falling off or shifting. Moreover, in the case where the material of the barrier structure and the material of the pixel defining layer include the fluorine-containing resin, similar as the pixel defining layer, the portion of the barrier structure in uppermost about 100 nm thickness may also become lyophobic during performing exposure, development, baking processes on the barrier structure, thereby suppressing the climbing effect of the ink droplets.

Optionally, a difference between the distance from the upper surface of the barrier structure 41 to the base substrate 1 and the distance from the upper surface of the pixel defining layer 31 to the base substrate 1 may be in a range of 0.5~5 μm.

If the above difference is less than 0.5 μm, that is, the barrier structure is nearly level with the pixel defining layer, then the ink droplets will still climb a great height along the sidewalls of the barrier structure. In such a case, suppressing the climbing effect of the ink droplets will not be achieved. If the above difference is greater than 5 μm, that is, the barrier structure is small in height, then a height of the light emitting layer to be formed is small. In such a case, the display function may not be effectively achieved.

In the above array substrate provided by the embodiment of the present disclosure, since the difference between the distance from the upper surface of the barrier structure to the base substrate and the distance from the upper surface of the pixel defining layer to the base substrate is in a range of 0.5~5 μm, during the inkjet printing is performed, the climbing height of the ink droplets is decreased compared to the case where the barrier structure is not provided, and problems such as uneven display and low luminous efficiency due to the ink droplet climbing are alleviated. It should be noted that the difference between the distance from the upper surface of the barrier structure to the base substrate and the distance from the upper surface of the pixel defining layer to the base substrate may be dependent on a thickness of the light emitting layer required for each pixel. For example, the above difference may be in a range of 1~3 μm.

Optionally, a distance from the upper surface of the barrier structure to the anodes may be in a range of 0.1~5 μm, for example, 0.5~1.5 μm.

Optionally, a distance from the upper surface of the pixel defining layer to the base substrate may be in a range of 1~10 μm, for example, 1~5 μm. In order to ensure that the distance from the upper surface of the barrier structure to the base substrate is less than the distance from the upper surface of the pixel defining layer to the base substrate, the distance from the barrier structure to the anodes is set to 0.1~5 μm, for example, 0.5~1.5 μm, so as to suppress the climbing effect of the ink droplets.

As an example, a width of an orthogonal projection of the barrier structure on the base substrate may be in a range of 1~3 μm, for example, 1.5~2.5 μm. Specific values may be selected depending on specific pixel structures, and are not specifically limited herein.

It should be noted that, when the barrier structure is exposed, a boundary of a mask coincides with or slightly overlaps with a boundary of the pixel defining layer. Though the boundary of the mask may slightly overlap with the boundary of the pixel defining layer, the overlapping range is within an error-allowed range, which is not specifically limited herein.

Optionally, a material of the anode may include a transparent conductive material or a semi-transparent conductive material. For example, the anode may include a transparent material and the cathode may include a reflective material to form a bottom emitting organic electroluminescent device. Alternatively, the anode may include a reflective material and the cathode may include a transparent material to form a top emitting organic electroluminescent device. In addition, depending on the structure of the device, the choice of anode materials is also different, and the anode materials may be selected from transparent or translucent materials such as ITO, Ag, NiO, Al, and graphene, which have high work functions.

Figure 2A:
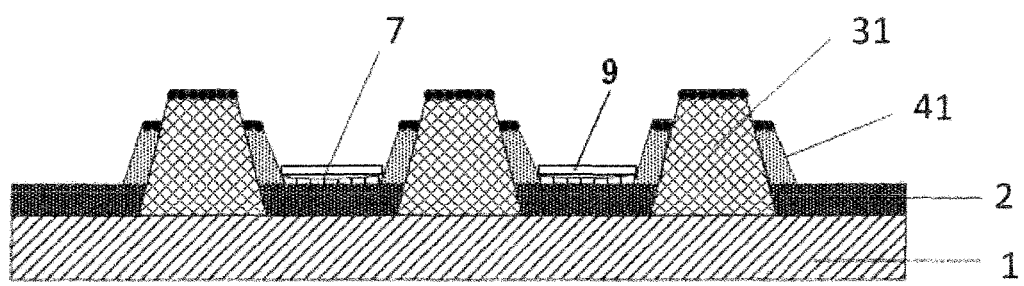
FIG. 2a is a schematic structural view of a substrate according to an embodiment of the present disclosure, wherein a light emitting layer and cathodes are shown.

As shown in FIG. 2a, the array substrate according to an embodiment of the present disclosure may further include a light emitting layer 7 and cathodes 9 on the anodes 2.

The light emitting layer 7 may be formed on the anodes 2 by inkjet printing. For example, the light emitting layer may include at least a red light emitting sub-layer, a green light emitting sub-layer, and a blue light emitting sub-layer. In addition, the light-emitting layer may further include a white light emitting sub-layer, which depends on an arrangement of specific pixels, and is not specifically limited herein.

Figure 2B:
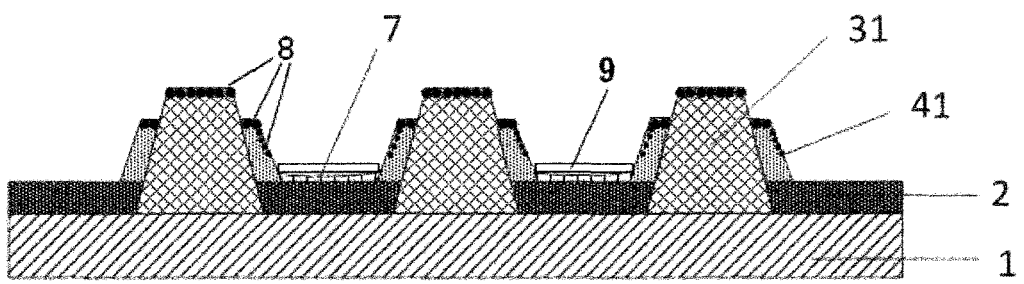
FIG. 2b is a schematic structural view of a substrate according to another embodiment of the present disclosure, wherein a light emitting layer and cathodes are shown.

FIG. 2b shows a structure of an array substrate according to another embodiment of the present disclosure. In the illustrated embodiment, not only the upper surface of the barrier structure 41 is lyophobic, but also side surfaces of the barrier structure 41 are lyophobic. Illustratively, a portion of the side surfaces of the barrier structure 41 are lyophobic, as indicated by lyophobic layers 8 in FIG. 2b. For example, a portion of the side surfaces of the barrier structure 41 above the light emitting layer 7 are lyophobic. Similar to the above embodiments, a material used for forming the barrier structure may contain a component of fluororesin, and the component of fluororesin moves to the upper surface and side surfaces of the material of the barrier structure and is about 100 nm thick during patterning and processing the barrier structure, so that both a portion of the barrier structure from the upper surface of the barrier structure to a position which is distant from the upper surface by about 100 nm and a portion of the barrier structure from the side surface of the barrier structure to a position which is distant from the side surface by about 100 nm are lyophobic. In this way, the climbing height of the ink droplets is greatly decreased, so that the display uniformity among the pixels and the luminous efficiency of each pixel are improved, thereby improving the display effect of the display panel.

Figure 3:
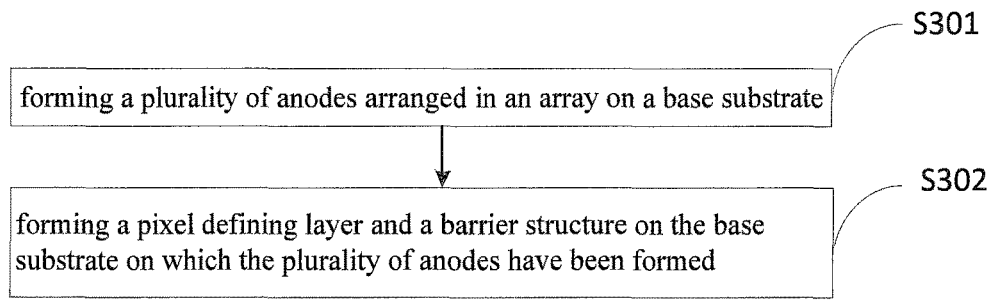
FIG. 3 is a flowchart of a method of preparing a substrate according to an embodiment of the present disclosure.

According to another embodiment of the present disclosure, a method of preparing a substrate is also provided. As shown in FIG. 3, the method includes:

S301. forming a plurality of anodes arranged in an array on a base substrate;

S302. forming a pixel defining layer and a barrier structure on the base substrate on which the plurality of anodes have been formed.

The pixel defining layer is located between each two adjacent anodes of the plurality of anodes, and the barrier structure is located on at least one sidewall of at least one opening region defined by the pixel defining layer. A distance from an upper surface of the barrier structure to the base substrate is less than a distance from an upper surface of the pixel defining layer to the base substrate. As an example, the upper surface of the barrier structure is lyophobic.

In other embodiments, other surfaces of the barrier structure may be lyophobic, for example, a part of side surfaces of the barrier structure may be lyophobic.

Figure 4:
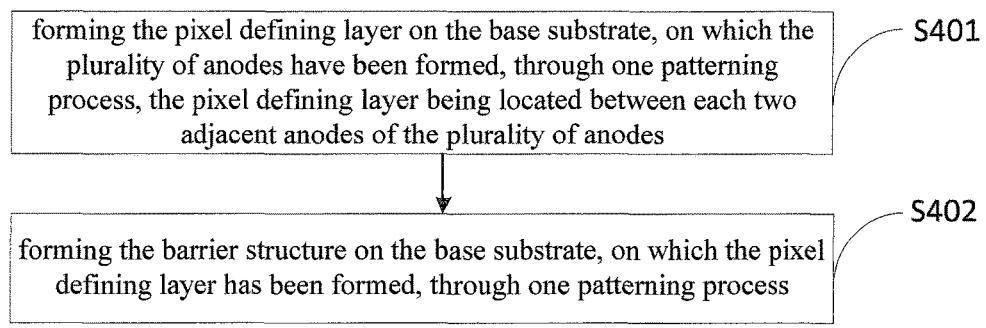
FIG. 4 is a flowchart of a method of preparing a substrate according to an embodiment of the present disclosure.

As shown in FIG. 4, forming a pixel defining layer and a barrier structure on the base substrate on which the plurality of anodes have been formed specifically includes:

S401. forming the pixel defining layer on the base substrate, on which the plurality of anodes have been formed, through one patterning process, the pixel defining layer being located between each two adjacent anodes of the plurality of anodes;

S402. forming the barrier structure on the base substrate, on which the pixel defining layer has been formed, through one patterning process.

The method of preparing a substrate provided by the embodiment of the present disclosure will be described below by way of example. As shown in FIGS. 5a to 5e, the method includes the following steps.

Figure 5A:
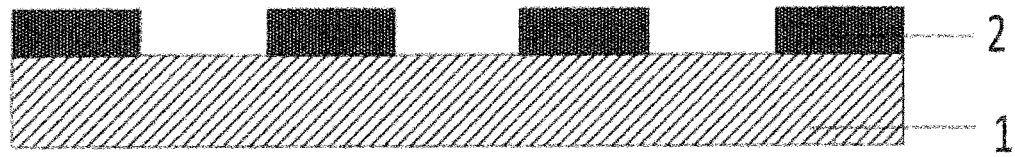
FIG. 5a to FIG. 5e are schematic structural views of a substrate according to an embodiment of the present disclosure after performing various steps.

As shown in FIG. 5a, a plurality of anodes 2 arranged in an array are formed on the base substrate 1.

Figure 5B:
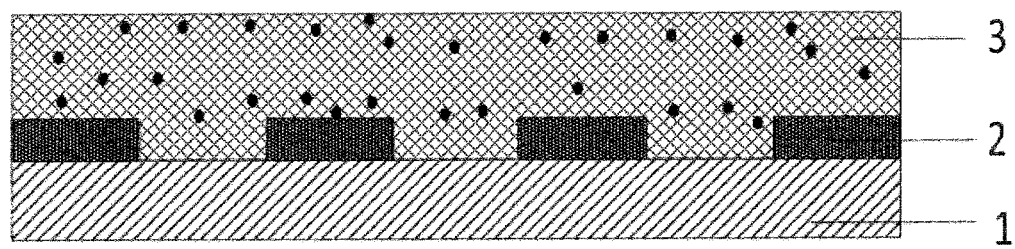

As shown in FIG. 5b, a first photoresist film 3 is formed on the base substrate 1 on which the plurality of anodes 2 have been formed.

Figure 5C:
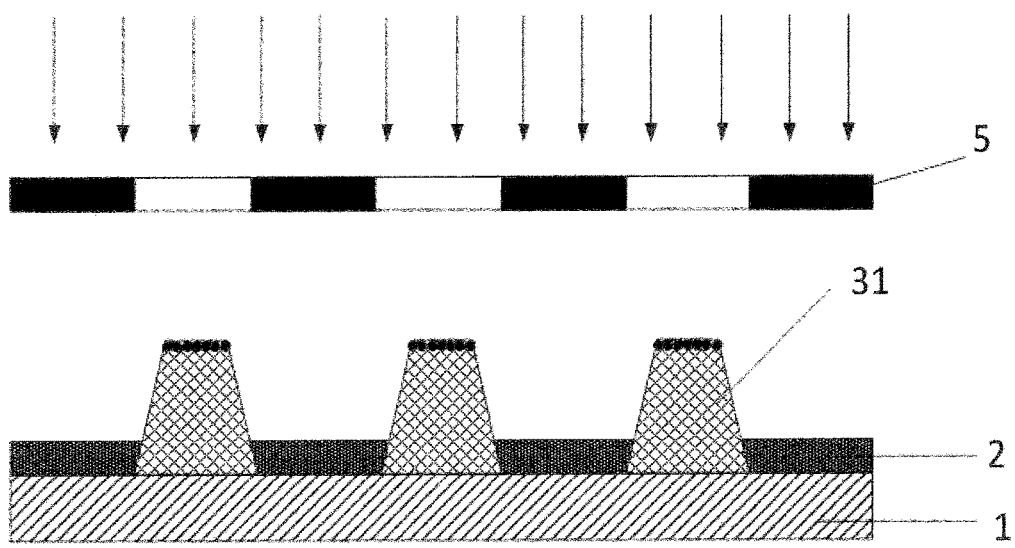

As shown in FIG. 5c, a pixel defining layer is formed through one patterning process. For example, the first photoresist film 3 is exposed by using a first mask 5, developed and baked to form the pixel defining layer 31 between each two adjacent anodes of the plurality of anodes 2. In an example, an upper surface of the pixel defining layer 31 is lyophobic, and the other portions of the pixel defining layer 31 are lyophilic.

Figure 5D:
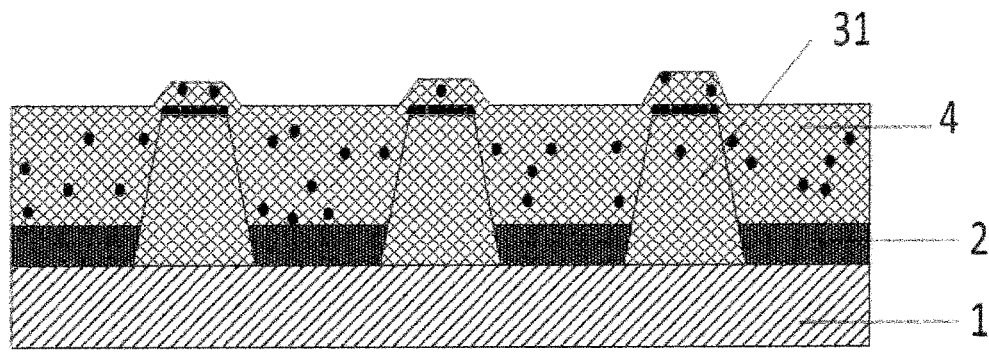

As shown in FIG. 5d, a second photoresist film 4 is formed on the base substrate 1 on which the pixel defining layer 31 has been formed.

Figure 5E:
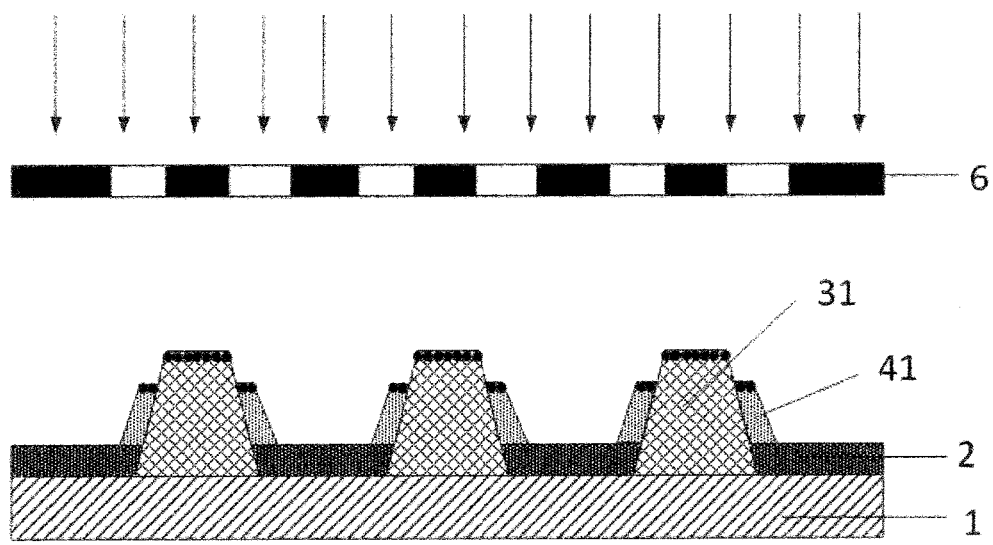

As shown in FIG. 5e, the second photoresist film 4 is exposed by using a second mask 6, developed and baked to form the barrier structure 41 on sidewalls of the opening region. In an example, an upper surface of the barrier structure 41 is lyophobic, and the other portions of the barrier structure 41 are lyophilic.

It should be noted that in the method of preparing the above-mentioned substrate provided by the embodiment of the present disclosure, in the steps shown in FIGS. 5c and 5e, the first photoresist film and the second photoresist film are exposed by using a negative photoresist. However, in other implementations, the first photoresist film and the second photoresist film may also be exposed by using a positive photoresist. The specific exposure mode may be selected according to actual application conditions, which is not specifically limited herein.

Figure 6:
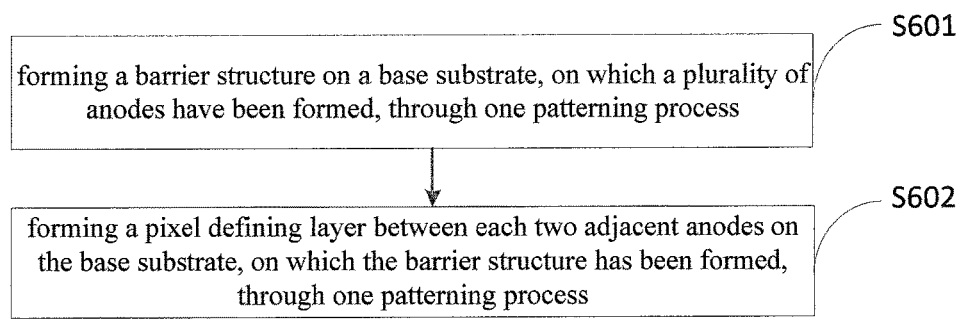
FIG. 6 is a flowchart of a method of preparing a substrate according to another embodiment of the present disclosure.
Figure 7:
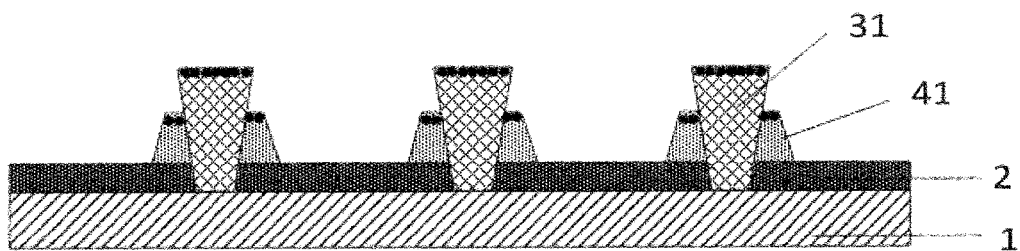
FIG. 7 is a schematic structural view of a substrate obtained by the method shown in FIG. 6.

According to another embodiment of the present disclosure, a method of preparing a substrate is also provided. As shown in FIG. 6, the method may include: step S601: firstly forming a barrier structure on a base substrate, on which a plurality of anodes have been formed, through one patterning process; and step S602: then forming a pixel defining layer between each two adjacent anodes on the base substrate, on which the barrier structure has been formed, through one patterning process. A schematic view of a structure of the substrate formed by the above method is shown in FIG. 7. Compared with the method in which the pixel defining layer is firstly formed and the barrier structure is then formed, the process principle and other steps in the method shown in FIG. 6 are substantially the same, and only the used masks may be different. Thus, the method shown in FIG. 6 is not described in detail here.

In the above method, the barrier structure and the pixel defining layer may be made of the same material. For example, the barrier structure and the pixel defining layer may be made of fluorine-containing resin material.

Figure 8:
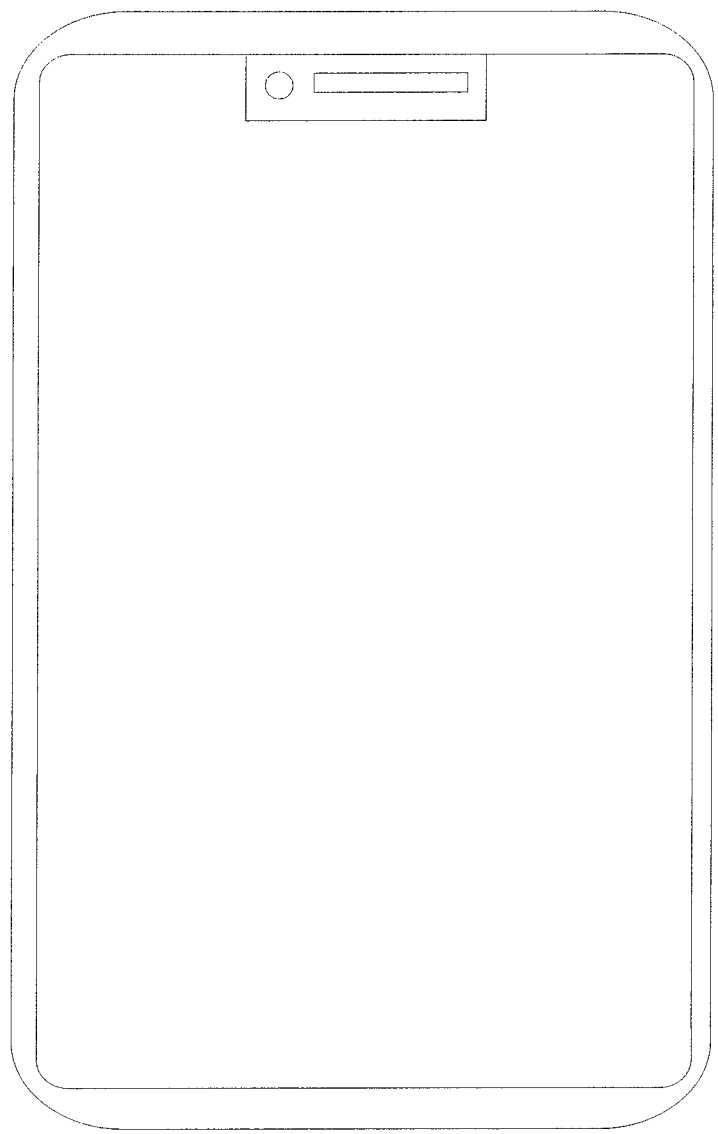
FIG. 8 is a schematic structural diagram of a display device according to an embodiment of the present disclosure.

According to still another embodiment of the present disclosure, there is also provided a display device including the substrate in the above embodiments. For example, as shown in FIG. 8, the display device may be any product or component having a display function, such as a mobile phone, a tablet computer, a television, a display, a notebook computer, a digital photo frame, a navigator, etc., which is not limited herein.

The substrate according to the embodiment of the present disclosure includes: a base substrate, a plurality of anodes arranged in an array on the base substrate, and a pixel defining layer between each two adjacent anodes of the plurality of anodes. The substrate further includes a barrier structure. The barrier structure is attached to sidewalls of the opening region defined by the pixel defining layer. A distance from an upper surface of the barrier structure to the base substrate is less than a distance from an upper surface of the pixel defining layer to the base substrate. With the arrangement of the barrier structure, a climbing height of the ink droplets in the pixel is dependent on the height of the barrier structure. Since the distance from the upper surface of the barrier structure to the base substrate is less than the distance from an upper surface of the pixel defining layer to the base substrate, a climbing effect of the ink droplets in the pixel may be effectively suppressed with the arrangement of the barrier structure, thereby improving a display effect of the display panel.

It will be apparent to those skilled in the art that various modifications and variations can be made to the embodiments of the present disclosure without departing from the spirit and scope of the disclosure. In this way, if these modifications and variations of the present disclosure belong to the scope of the claims of the present disclosure and their equivalent technologies, the present disclosure also intends to include these modifications and variations.

What is claimed is:

1. A substrate, comprising:
    a base substrate;
    a pixel defining layer on the base substrate, the pixel defining layer defining a plurality of opening regions arranged in an array, each of the plurality of opening regions having a plurality of sidewalls; and
    a barrier structure attached to at least one sidewall of at least one opening region,
    wherein a top surface of the barrier structure is parallel to a top surface of the pixel defining layer, and both the top surface of the barrier structure and the top surface of the pixel defining layer are parallel to a surface of the base substrate on which the pixel defining layer is located, a distance from the top surface of the barrier structure to the surface of the base substrate is less than a distance from the top surface of the pixel defining layer to the surface of the base substrate, and at least a part of surfaces of the barrier structure are lyophobic.

2. The substrate of claim 1, wherein the top surface of the barrier structure is lyophobic.

3. The substrate of claim 1, wherein the barrier structure is attached to all sidewalls of the at least one opening region.

4. The substrate of claim 1, wherein the substrate further comprises a plurality of electrodes on the base substrate, and there is a gap between a bottom surface of the barrier structure and the plurality of electrodes.

5. The substrate of claim 1, wherein the substrate further comprises a plurality of electrodes on the base substrate, and a bottom surface of the barrier structure contacts the plurality of electrodes.

6. The substrate of claim 1, wherein the top surface of the pixel defining layer is lyophobic.

7. The substrate of claim 1, wherein a material of the barrier structure is the same as a material of the pixel defining layer.

8. The substrate of claim 1, wherein at least one of a material of the barrier structure and a material of the pixel defining layer comprises fluorine-containing resin.

9. The substrate of claim 1, wherein a difference between the distance from the top surface of the barrier structure to the base substrate and the distance from the top surface of the pixel defining layer to the base substrate is in a range of 0.5~5 μm.

10. The substrate of claim 4, wherein a distance from the top surface of the barrier structure to the plurality of electrodes is in a range of 0.1~5 μm.

11. A display device comprising the substrate of claim 1.

12. A method of preparing a substrate, comprising:
    providing a base substrate; and
    forming a pixel defining layer and a barrier structure on the base substrate, the pixel defining layer defining a plurality of opening regions arranged in an array, each of the plurality of opening regions having a plurality of sidewalls, the barrier structure being attached to at least one sidewall of at least one opening region,
    wherein a top surface of the barrier structure is parallel to a top surface of the pixel defining layer, and both the top surface of the barrier structure and the top surface of the pixel defining layer are parallel to a surface of the base substrate on which the pixel defining layer is located, a distance from the top surface of the barrier structure to the surface of the base substrate is less than a distance from the top surface of the pixel defining layer to the surface of the base substrate, and at least a part of surfaces of the barrier structure are lyophobic.

13. The method of claim 12, wherein forming the pixel defining layer and the barrier structure on the base substrate comprises:
    forming the pixel defining layer on the base substrate; and
    forming the barrier structure on the at least one sidewall of the at least one opening region.

14. The method of claim 12, wherein forming the pixel defining layer and the barrier structure on the base substrate comprises:
    forming the barrier structure on the base substrate; and
    forming the pixel defining layer on the base substrate on which the barrier structure has been formed.

15. The method of claim 12, wherein forming the pixel defining layer on the base substrate comprises:
    forming the pixel defining layer on the base substrate through one patterning process.

16. The method of claim 12, wherein forming the barrier structure on the base substrate comprises:
    forming the barrier structure on the base substrate through one patterning process.

17. The method of claim 15, wherein forming the pixel defining layer on the base substrate through one patterning process comprises:
    forming a first photoresist film on the base substrate; and
    exposing the first photoresist film with a first mask, then developing and baking the first photoresist film to form the pixel defining layer.

18. The method of claim 16, wherein forming the barrier structure on the base substrate through one patterning process comprises:
    forming a second photoresist film on the base substrate; and exposing the second photoresist film with a second mask, then developing and baking the second photoresist film to form the barrier structure.

19. The method of claim 12, wherein a material of the barrier structure is the same as a material of the pixel defining layer.

20. The method of claim 12, wherein at least one of a material of the barrier structure and a material of the pixel defining layer comprises fluorine-containing resin.

* * * * *